US007215174B1

United States Patent
Summer

(10) Patent No.: US 7,215,174 B1
(45) Date of Patent: May 8, 2007

(54) METHOD AND APPARATUS FOR IMPLEMENTING A RADIATION HARDENED N-CHANNEL TRANSISTOR WITH THE USE OF NON-RADIATION HARDENED TRANSISTORS

(76) Inventor: Steven E. Summer, 1 Roned Rd., Shirley, NY (US) 11967

( * ) Notice: Subject to any disclaimer, the term of this patent is extended or adjusted under 35 U.S.C. 154(b) by 0 days.

(21) Appl. No.: 11/295,985

(22) Filed: Dec. 7, 2005

(51) Int. Cl.
*H03K 17/687* (2006.01)
(52) U.S. Cl. .................. 327/427; 327/529; 327/186
(58) Field of Classification Search .................. None
See application file for complete search history.

(56) References Cited

U.S. PATENT DOCUMENTS 5,115,143 A * 5/1992 Rohulich et al. ........... 327/109
6,335,654 B1 * 1/2002 Cole ........................... 327/546
7,116,153 B2 * 10/2006 Pai ............................. 327/430

* cited by examiner

*Primary Examiner*—Timothy P. Callahan
*Assistant Examiner*—An T. Luu
(74) *Attorney, Agent, or Firm*—Stephen E. Feldman PC

(57) ABSTRACT

A non-radiation hardened N-channel transistor used in a power switching circuit functioning in a high-ionizing, radiation-dose environment. The circuit including at least one non-radiation hardened N-channel MOSFET switching transistors, the transistor having a gate, drain and a source. The circuit also includes a stored voltage source. The stored voltage source is in series with the gate of the at least one non-radiation hardened N channel MOSFET switching transistors. A high impedance bleeder resistor is connected to the stored voltage source for returning the positive terminal of the stored voltage source to the channel MOSFET source terminal.

10 Claims, 1 Drawing Sheet

METHOD AND APPARATUS FOR IMPLEMENTING A RADIATION HARDENED N-CHANNEL TRANSISTOR WITH THE USE OF NON-RADIATION HARDENED TRANSISTORS

OBJECT OF THE INVENTION

The object of this invention is a method and apparatus showing the use of conventional N-channel FETs in a high ionizing radiation dose environment such as found in spacecraft and particle accelerator applications.

BACKGROUND OF THE INVENTION

A preferred semiconductor device for power control is the insulated gate FET (Field Effect Transistor) because of its high power gain. FETs used for power switching use are usually enhancement mode types. This means that they are normally non-conducting. When a gate voltage above a threshold is applied, the FET becomes conducting. FETs are available in two gate polarities; N channel and P channel.

Power switching circuits designed for general purpose use are usually constructed with N channel FETs because, for any given die size transistor, the N channel FET has a lower on resistance than a correspondingly sized P channel FET would have.

Present art for radiation hardened power switching circuits use specially designed radiation hardened N-channel FETs for power switching functions. The principal benefit of these radiation hardened N-channel FETs parts is that the gate threshold voltage doesn't change much after being exposed to radiation. However, these parts have limited sources of supply, are expensive and may have long lead times, leading to higher prices and longer delivery times for the radiation tolerant circuits that incorporate these types of parts.

If conventional non-radiation hardened N Channels FETs are used in switching applications where radiation is present, the function tends to fail at relatively low radiation levels because the gate threshold voltage of the N channel FET shifts more negatively with accumulated radiation dose, and ultimately falls close to zero. At this point, the N channel FET conducts current with little or no gate voltage applied. Therefore, the part is difficult to control, since, after a certain amount of accumulated ionizing radiation, the FET drain to source channel will be conducting with no applied power.

SUMMARY OF THE INVENTION

A non-radiation hardened N-channel transistor used in a power switching circuit functioning in a high-ionizing, radiation-dose environment comprising at least one non-radiation hardened N-channel MOSFET switching transistors, the at least one transistor having a gate, drain and a source, and a stored voltage source, said stored voltage source being in series with the gate of the at least one non-radiation hardened N channel MOSFET switching transistors; and a high impedance bleeder resistor, said bleeder resistor returning the positive terminal of the stored voltage source to the channel MOSFET source terminal.

The non-radiation hardened N-channel MOSFET switching transistors retains power control over the switching circuit despite parametric shifts accumulated in the high-ionizing, radiation-dose environment.

The stored voltage source may be a primary battery, a secondary battery, a charged capacitor or an electret. If the stored voltage source is a secondary battery or a charged capacitor a low leakage diode may be connected to the voltage source for periodically recharging the stored voltage source.

DETAILED DESCRIPTION OF THE INVENTION

Figure 1:
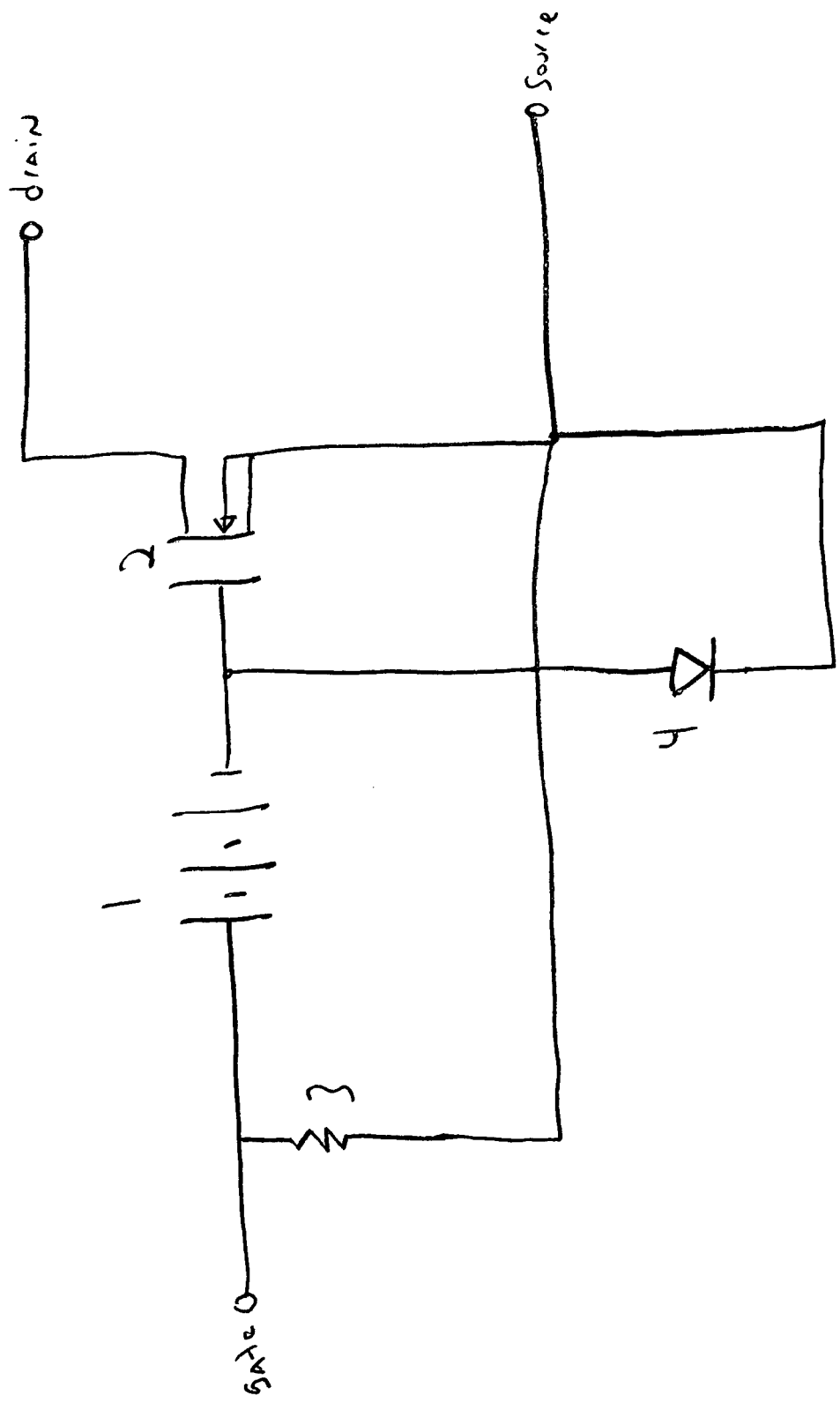
FIG. 1 is a block diagram showing a preferred embodiment of the invention.

In an FET, current flows along a semiconductor path called the channel. At one end of the channel, there is a source electrode, and at the other end, a drain electrode. The physical diameter of the channel is fixed, but its effective electrical diameter is changed by applying voltage to a gate electrode. The conductivity of the FET depends, at any given time, on the electrical diameter of the channel. A small change in gate voltage can cause a large variation in current from the source to the drain. In this way, the FET switches current on or off.

Typically, FETs used for power switching are enhancement mode types, that is, they are normally non-conducting. When a gate voltage above a certain threshold is applied, the FET becomes conducting. Such FETs are used to control current flow and are available in two gate polarities—N channel and P channel.

Field-effect transistors exist in two major classifications, the junction FET (JFET) and the metal-oxide semiconductor FET (MOSFET). A MOSFET is a special type of FET that works by electronically varying the width of a channel along which charge carriers (electrons or holes) flow. Wider channels provide better conductivity. The charge carriers enter the channel at the source, and exit via the drain. The width of the channel is controlled by the voltage on an electrode called the gate, which is located physically between the source and the drain and is insulated from the channel by an extremely thin layer of metal oxide.

There are two ways in which a MOSFET can function. The first is known as depletion mode. When there is no voltage on the gate, the channel exhibits its maximum conductance. As the voltage on the gate increases (either positively or negatively, depending on whether the channel is made of P-type or N-type semiconductor material), the channel conductivity decreases. The second mode of MOSFET operation is called enhancement mode. When there is no voltage on the gate, there is in effect no channel, and the device does not conduct. A channel is produced by the application of a voltage to the gate. Increasing gate voltage increases conductivity and thus, current flow.

The MOSFET has certain advantages over the conventional junction FET or JFET because the gate is insulated electrically from the channel. No current flows between the gate and the channel, regardless of the gate voltage (as long as it does not become so great that it causes physical breakdown of the metallic oxide layer). Thus, the MOSFET has practically infinite impedance.

When conventional non-radiation hardened N Channels FETs are used in applications where radiation is present, the FETs become uncontrollable at relatively low radiation levels because the gate threshold voltage of the N channel FET experiences a negative shift, and ultimately falls close to zero. At that point, the N channel FET conducts current with little or no gate voltage applied making it uncontrollable, like a flood gate that cannot be closed.

The gate threshold voltage of a conventional, non-radiation hardened P channel FET also shifts negatively with radiation exposure. However, the initial threshold voltage of an ordinary P channel FET is negative to begin with. In the presence of radiation, therefore, the gate threshold voltage does not approach zero and therefore will not become uncontrollable. The gate threshold voltage does change, but from a negative value to a more negative value. Conventional P channel FETs, therefore, are more robust to total radiation dose effects as compared to conventional N channel FETs when the proper gate drive signal is provided.

As will be shown in the present invention, when operating in radiation environment, the N-Channel FET will need certain drive requirements. In the on state, positive gate to source drive waveform must be sufficiently high in magnitude to saturate the drain to source channel. It must, however, not be so high that the gate to source breakdown voltage rating of the FET is exceeded. It is important to maximize the magnitude of the gate voltage signal, because the higher the signal magnitude is, the higher radiation dose the FET will tolerate and still work acceptably in the circuit.

In the off state gate to source drive signal must be sufficiently low to reduce current flow through the drain to source channel. It must however, not be so high in negative magnitude that that the gate can rupture due to passage of high energy particles normally encountered in radiation environments.

In accordance with an embodiment of the present invention, as shown in FIG. 1, the negative terminal of a stored voltage source 1 is placed in series with the gate terminal of the N channel FET 2. The polarity of the stored voltage source 1 is such that, with no external power applied, the gate voltage of the N-channel FET 2 is negative with respect to the source. The stored voltage source 1 may be a primary battery, secondary battery, charged capacitor, electret or similar device.

The bleeder resistor 3 is placed in parallel with the stored voltage source 1. The purpose of the bleeder resistor 3 is to provide a relatively high impedance return for the positive stored voltage source 1 to the source terminal of the non radiation hardened N channel MOSFET switching transistor 2.

As an option, a low leakage diode 4 may be connected to the gate of the non-radiation hardened N channel MOSFET switching transistors 2. In the event a secondary battery or capacitor is used as the stored voltage source 1, the stored voltage source 1 may be recharged through the low leakage diode.

In use the switching circuit of the present invention will be controllable in the presence of radiation. In the on state, a drive waveform will be applied to the gate to source channel of the transistor 2. This waveform will be sufficiently high in magnitude to saturate the drain to source channel. Please note, it must not be so high that the gate to source breakdown voltage rating of the FET is exceeded. Once the magnitude of the gate voltage signal is maximized the FET will be capable of tolerating and still work acceptably in the radiation environment.

In the off state, the drive signal applied to the gate to source channel must be sufficiently low to reduce current flow through the drain to source channel. Please note that the waveform must not so low in valve that it becomes a high negative magnitude. If a high negative value is applied to the transistor the gate of the transistor may rupture due to passage of high energy particles normally encountered in radiation environments.

In the preceding specification, the invention has been described with reference to specific exemplary embodiments thereof. It will however, be evident that various modifications and changes may be made thereto without departing from the broader spirit and scope of the invention as set forth in the claims that follow. The specification and drawings are accordingly to be regarded in an illustrative manner rather than a restrictive sense.

What is claimed:

1. A non-radiation hardened N-channel transistor used in a power switching circuit functioning in a high-ionizing, radiation-dose environment comprising:
   at least one non-radiation hardened N-channel MOSFET switching transistors, the at least one transistor having a gate, a drain and a source;
   a stored voltage source, said stored voltage source having a positive terminal and a negative terminal, said stored voltage source being in series with the gate of the at least one non-radiation hardened N channel MOSFET switching transistors; and
   a high impedance bleeder resistor, said bleeder resistor returning the positive terminal of the stored voltage source to the channel MOSFET source terminal.

2. The non-radiation hardened N-channel transistor used in a power switching circuit functioning in a high-ionizing, radiation-dose environment as claimed in claim 1 wherein the non-radiation hardened N-channel MOSFET switching transistors retains power control over the switching circuit despite parametric shifts accumulated in the high-ionizing, radiation-dose environment.

3. The non-radiation hardened N-channel transistor used in a power switching circuit functioning in a high-ionizing, radiation-dose environment as claimed in claim 1 wherein when the transistor is in an on-state a maximized drive waveform is applied to the gate to source channel of the transistor thereby allowing the transistor to tolerate and function in the high-ionizing, radiation-dose environment.

4. The non-radiation hardened N-channel transistor used in a power switching circuit functioning in a high-ionizing, radiation-dose environment as claimed in claim 1 whereby when the transistor is in an off-state a sufficiently low drive waveform is applied to the gate to source channel of the transistor.

5. The non-radiation hardened N-channel transistor used in a power switching circuit functioning in a high-ionizing, radiation-dose environment as claimed in claim 1 wherein the stored voltage source is a primary battery.

6. The non-radiation hardened N-channel transistor used in a power switching circuit functioning in a high-ionizing, radiation-dose environment as claimed in claim 1 wherein the stored voltage source is a secondary battery.

7. The non-radiation hardened N-channel transistor used in a power switching circuit functioning in a high-ionizing, radiation-dose environment as claimed in claim 1 wherein the stored voltage source is a charged capacitor.

8. The non-radiation hardened N-channel transistor used in a power switching circuit functioning in a high-ionizing, radiation-dose environment as claimed in claim 1 wherein the stored voltage source is an electret.

9. The non-radiation hardened N-channel transistor used in a power switching circuit functioning in a high-ionizing, radiation-dose environment as claimed in claim 3 further comprising:
   a low leakage diode, said diode periodically recharging the stored voltage source.

10. The non-radiation hardened N-channel transistor used in a power switching circuit functioning in a high-ionizing, radiation-dose environment as claimed in claim 4 further comprising:

a low leakage diode, said diode periodically recharging the stored voltage source.

* * * * *